United States Patent
Zhang et al.

(10) Patent No.: US 10,341,418 B2
(45) Date of Patent: Jul. 2, 2019

(54) REDUCING NETWORK BANDWIDTH UTILIZATION DURING FILE TRANSFER

(71) Applicant: Microsoft Technology Licensing, LLC, Redmond, WA (US)

(72) Inventors: Dachuan Zhang, Sunnyvale, CA (US); Kushal Gurunath Sukthankar, Sunnyvale, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 448 days.

(21) Appl. No.: 15/097,164

(22) Filed: Apr. 12, 2016

(65) Prior Publication Data

US 2017/0134296 A1   May 11, 2017

Related U.S. Application Data

(60) Provisional application No. 62/252,215, filed on Nov. 6, 2015.

(51) Int. Cl.
*H04L 29/08* (2006.01)
*H04L 29/06* (2006.01)
(Continued)

(52) U.S. Cl.
CPC .............. *H04L 67/06* (2013.01); *G06F 9/452* (2018.02); *H03M 7/30* (2013.01);
(Continued)

(58) Field of Classification Search
None
See application file for complete search history.

(56) References Cited

U.S. PATENT DOCUMENTS 5,970,496 A * 10/1999 Katzenberger .... G06F 17/30958
6,857,102 B1    2/2005 Bickmore et al.
(Continued)

FOREIGN PATENT DOCUMENTS

WO    WO2014184372    11/2014

OTHER PUBLICATIONS

FileCatalyst reinventing file transfer, Copyright 2010 available at: www.filecatalyst.com, 13 pps.
(Continued)

*Primary Examiner* — Jeffrey R Swearingen
(74) *Attorney, Agent, or Firm* — Michael Best & Friedrich LLP

(57) ABSTRACT

Technologies are described herein for reducing network bandwidth utilization during file transfer. An application or another type of program identifies embedded objects in a file. The application then replaces the embedded objects with corresponding unique placeholder objects that are more highly compressible than the embedded objects. The application then compresses the file containing the unique placeholder objects. The application then transmits the compressed file to a network service that provides functionality for converting the file format of the file or for processing the file in another manner. The processed file generated by the network service also includes the unique placeholder objects. When the application receives the processed file from the network service, the application replaces the unique placeholder objects in the processed file with the embedded objects from the original file. The application can then open the processed file for viewing, editing, or another purpose.

19 Claims, 8 Drawing Sheets

(51) Int. Cl.
*H03M 7/30* (2006.01)
*G06F 9/451* (2018.01)
(52) U.S. Cl.
CPC .......... *H04L 67/2828* (2013.01); *H04L 69/04* (2013.01); *H04L 67/12* (2013.01)

(56) References Cited

U.S. PATENT DOCUMENTS

| | | |
|---|---|---|
| 7,117,210 B2 | 10/2006 | DeSalvo |
| 7,296,059 B2 | 11/2007 | Fujiwara |
| 8,046,331 B1* | 10/2011 | Sanghavi .......... G06F 17/30221 358/1.16 |
| 8,131,693 B2 | 3/2012 | Hiltunen et al. |
| 8,156,228 B1* | 4/2012 | Hernacki ................ H04L 67/02 709/217 |
| 8,935,322 B1 | 1/2015 | Grosz et al. |
| 9,405,767 B2* | 8/2016 | Novak ............. G06F 17/30115 |
| 2003/0055907 A1 | 3/2003 | Stiers |
| 2007/0035764 A1 | 2/2007 | Aldrich et al. |
| 2007/0140559 A1 | 6/2007 | Rambharack et al. |
| 2008/0043111 A1 | 2/2008 | Anderson |
| 2010/0211651 A1 | 8/2010 | Guedalia et al. |
| 2012/0117159 A1 | 5/2012 | Chakra et al. |
| 2017/0264672 A1* | 9/2017 | Reich ................ H04N 21/4334 |

OTHER PUBLICATIONS

Steps to reduce the size of files/presentations created in MS Powerpoint—Windows, Published online 2015, available at: : http://ccnmtl.columbia.edu/web/assets/pdf/ppt_file_size.pdf, 6 pps.

* cited by examiner

REDUCING NETWORK BANDWIDTH UTILIZATION DURING FILE TRANSFER

CROSS-REFERENCE TO RELATED APPLICATIONS

This patent application claims the benefit of previously filed U.S. provisional patent application No. 62/252,215, entitled "Reducing Network Bandwidth Utilization During File Transfer," which was filed on Nov. 6, 2015, and which is expressly incorporated herein by reference in its entirety.

BACKGROUND

Certain legacy file formats are inherently less secure than more modern file formats. As a result, it can be undesirable to execute program code for opening such legacy file formats on user computing devices, such as smartphones or tablet computing devices. Additionally, porting and maintaining code for opening legacy formats can also be complicated and expensive. However, backward compatibility with legacy file formats is often desirable and, in some instances, a requirement. For example, it might be desirable, or even a legal requirement in some countries, for a user computing device to include the capability to open legacy file formats utilized for presentation documents, word processing documents, spreadsheet documents, and/or other types of documents.

In order to open legacy file formats in a more secure fashion, remotely executing network services can be utilized to convert files in a legacy file format to a newer, more secure, file format. These files, however, can include a number of large images or other types of embedded objects and, as a result, transmission of such files to a remote network service for conversion can utilize significant network bandwidth. Moreover, because a converted file also includes the same images or other embedded objects as the source file, the transmission of a converted file from the network service to the device requesting the conversion can also consume significant network bandwidth. This can be particularly problematic on wireless mobile devices where network operations are inherently slow. This can also be costly to a user where sending data costs money, such as on a wireless cellular network for example.

It is with respect to these and other considerations that the disclosure made herein is presented.

SUMMARY

Technologies are described herein for reducing network bandwidth utilization during file transfer. Through an implementation of the technologies disclosed herein, the network bandwidth utilized to transmit a file to a remote network service for format conversion, or another type of processing, can be significantly reduced. Similarly, the network bandwidth utilized to transmit a file that has been converted, or processed in another manner, from a network service to the computing device requesting the conversion can also be significantly reduced. Other technical benefits can also be realized through an implementation of the technologies disclosed herein.

According to one configuration disclosed herein, a software application executing on a computing device receives a request to open a file. For example, and without limitation, the application can receive a request to open a presentation document, a word processing document, a spreadsheet document, or another type of document for viewing, editing, or another purpose. Responsive to receiving such a request, the application identifies any objects that have been embedded in the file ("embedded objects"). Embedded objects include, but are not limited to, images, videos, audio files, and/or other types of objects that have been embedded in the file.

Once the application has identified the embedded objects in the file, the application replaces each embedded object with a corresponding placeholder object. The placeholder objects are unique objects that are more highly compressible than the embedded objects. For example, and without limitation, in one particular configuration, the placeholder objects are images of a single color that are the same height and width as the corresponding embedded object images. In this configuration, each of the placeholder object images has a unique color. Because the placeholder object images are the same height and width as the corresponding embedded object images, other metadata in the file describing the embedded object images does not need to be altered.

In one configuration, the application also generates hash values for the unique placeholder objects. In the configuration described above, wherein the placeholder objects are images having a unique color, each placeholder object image will have a unique hash value. The application stores the hash values and the original embedded object images for later use in replacing the placeholder object images in a processed version of the file with the original embedded object images.

Once the application has replaced the embedded objects in the file with the placeholder objects, the application compresses the file using a suitable data compression algorithm. Because, in the configuration described above, the placeholder object images only include a single color, they are very highly compressible. As a result, the compressed file containing the placeholder objects is much smaller in size than the original file. Consequently, the network bandwidth utilized to transmit the file to a remote network service for format conversion, or another type of processing, can be significantly reduced.

In some configurations, the file is an object linking and embedding ("OLE") structured storage file that includes summary information, a pictures stream containing embedded images, and a document stream. In this configuration, the summary information is removed from the file in order to reduce the file size even further. For example, the summary information can include a document preview image, which the application can remove from the file to further minimize the amount of data transmitted to and from a network service. In this configuration, the application can also insert padding bytes into the pictures stream such that the size of each placeholder object is the same as the corresponding embedded object in the file. The padding bytes are also highly compressible.

Once the application has compressed the file containing the placeholder objects, the application transmits the compressed file over a data communications network to a network service configured to generate a processed file based upon the file. For example, and without limitation, the network service can be configured to convert the file from one data format, such as a legacy file format for presentation documents, to another data format, such as a more modern file format for presentation documents. In other configurations, the network service is configured to process the file in another way, such as correcting the spelling or grammar of text contained in the file, making or suggesting stylistic changes to text in the file, and/or other types of processing.

Once the network service has completed its processing of the file, the network service transmits the processed file, which includes the placeholder objects, to the application. Because the processed file includes the placeholder objects rather than the original embedded objects, the network bandwidth required to transmit the processed file to the application is also significantly reduced.

The application receives the processed file from the network service and replaces each unique placeholder object in the processed file with its corresponding original embedded object. For example, in one particular configuration, the application utilizes the hash values generated for the unique placeholder objects to identify the corresponding embedded objects from the original file. The application then replaces each unique placeholder object with its corresponding embedded object. The application can then open the processed file for editing, viewing, and/or other purposes.

It should be appreciated that the above-described subject matter can be implemented as a computer-controlled apparatus, a computer process, a computing system, or as an article of manufacture such as a computer readable medium. These and various other features will be apparent from a reading of the following Detailed Description and a review of the associated drawings.

This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DETAILED DESCRIPTION

Figure 1A:
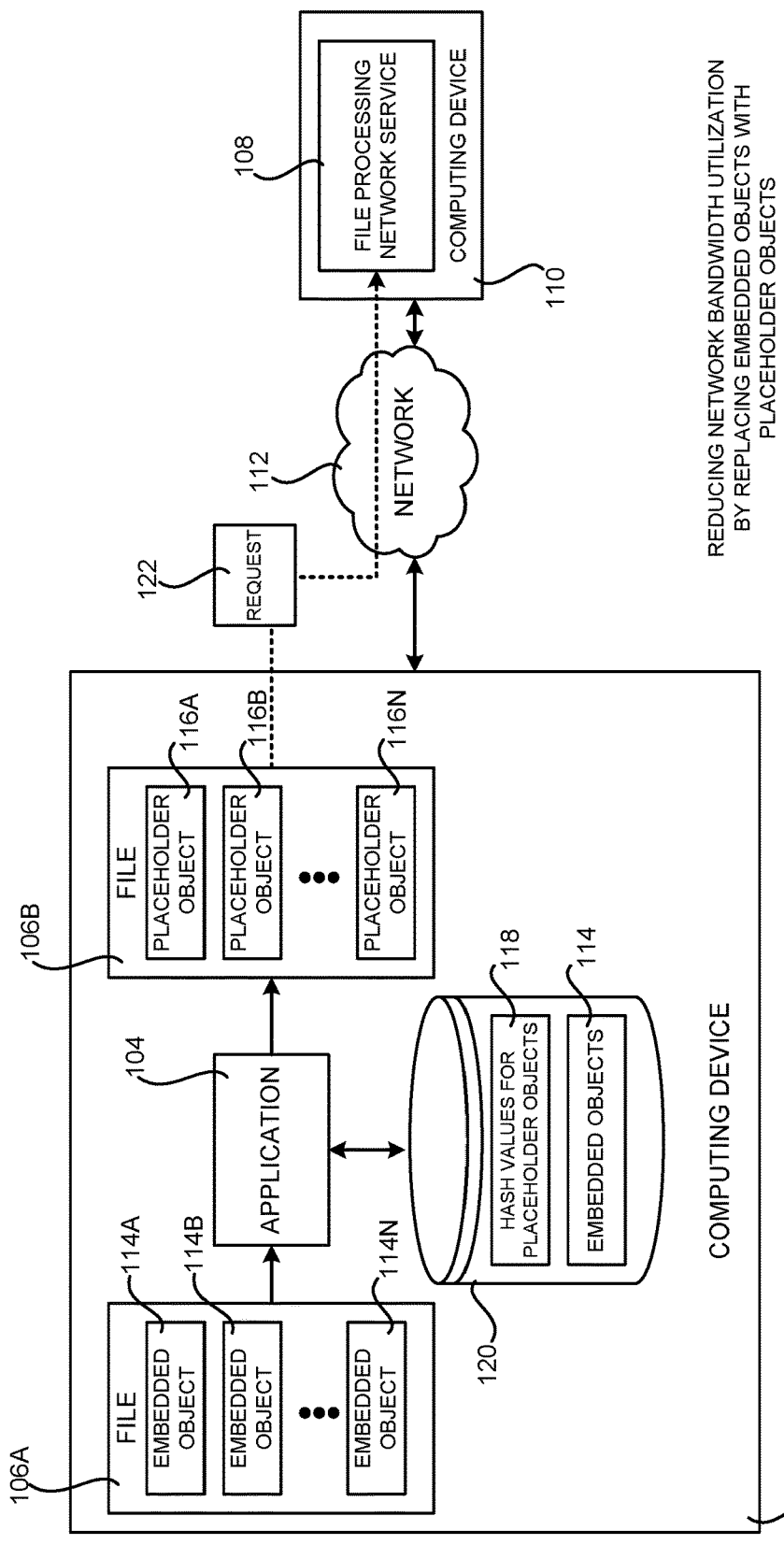
FIG. 1A is a computer system architecture diagram showing aspects of the configuration and operation of a computing device configured to reduce network bandwidth utilization by replacing embedded objects in a file with placeholder objects, according to one configuration disclosed herein.

The following detailed description is directed to technologies for reducing network bandwidth utilization during file transfer. As discussed briefly above, through an implementation of the technologies disclosed herein, the network bandwidth utilized to transmit a file to a remote network service for format conversion, or for another type of processing, can be significantly reduced. Similarly, the network bandwidth utilized to transmit a file that has been converted to a newer file format, or processed in another manner, from a network service to the device requesting the conversion can also be significantly reduced. Other technical benefits can also be realized through an implementation of the technologies disclosed herein.

While the subject matter described herein is presented in the general context of program modules that execute in conjunction with the execution of an operating system and application programs on a computer system, those skilled in the art will recognize that other implementations can be performed in combination with other types of program modules. Generally, program modules include routines, programs, components, data structures, and other types of structures that perform particular tasks or implement particular abstract data types. Moreover, those skilled in the art will appreciate that the subject matter described herein can be practiced with other computer system configurations, including hand-held devices, multiprocessor systems, microprocessor-based or programmable consumer electronics, minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of various technologies for reducing network bandwidth utilization during file transfer will be described.

FIG. 1A is a computer system architecture diagram showing aspects of the configuration and operation of a computing device 102 configured to reduce network bandwidth utilization by replacing embedded objects 114 in a file 106A with placeholder objects 116 prior to transmission over a network 112, according to one configuration disclosed herein. As shown in FIG. 1A and discussed briefly above, a software application 104 executing on the computing device 102 receives a request to open a file 106A.

For example, and without limitation, the application 104 can receive a request to open a presentation document, a word processing document, a spreadsheet document, or another type of document for viewing, editing, or another purpose. The application 104 can be implemented as a binary executable file, a dynamically linked library ("DLL"), an application programming interface ("API"), a network service, one or more script files, interpreted program code, a software container, an object file, bytecode suitable for just-in-time compilation, and/or another type of program code that can be executed by a processor to perform the operations described herein with regard to FIGS. 1A-3.

Responsive to receiving a request to open or otherwise access the contents of the file 106A, the application 104 identifies any objects 114 that have been embedded in the file 106A (referred to herein as "embedded objects"). The embedded objects 114 can include, but are not limited to, images, videos, audio files, and/or other types of objects that have been embedded in the file 106A. In the example shown in FIG. 1A, the application 104 has identified the embedded objects 114A-114N (which might be referred to as the embedded objects 114) in the file 106A.

In one particular configuration, which will be described below with regard to FIG. 3, the file 106A is an OLE structured storage file that includes summary information, a pictures stream containing embedded images, and a document stream. In this configuration, the application 104 can search the pictures stream for embedded objects 114. Other mechanisms can be utilized in other configurations to identify the embedded objects 114 in the file 106A.

In this regard, it should be appreciated that the technologies disclosed herein can be utilized with other types and numbers of files 106A and embedded objects 114 in other configurations. For example, and without limitation, the technologies disclosed herein can be utilized with binary file formats, extensible markup language ("XML")-based file formats, JavaScript Object Notation ("JSON")-based filed formats, and other types of file formats not specifically mentioned herein. In particular, the technologies can be utilized with .doc/.docx files, .ppt/.pptx files, .xls/.xlsx files, .pdf files, .odp/.ods/.odf files, and/or other file types not specifically identified herein. In this regard, it should be appreciated that the file 106B need not be of the same type as the file 204A.

Once the application 104 has identified the embedded objects 114 in the file 106A, the application 104 replaces each embedded object 114 with a corresponding placeholder object 116. The placeholder objects 116 are unique objects that are more highly compressible than the embedded objects 114. For example, and without limitation, in one particular configuration, the placeholder objects 116 are images of a single color that are the same height and width as the corresponding embedded object images 114. In this configuration, each of the placeholder object images has a unique color. Because the placeholder object images are the same height and width as the corresponding embedded object 114, other metadata in the file 106A describing the embedded object images 114 does not need to be altered.

In this regard, it should be appreciated that the placeholder objects 116 can be constructed in different ways depending upon the type of embedded object 114 and the particular requirements of the network service 108. For example, and as discussed above, for images (e.g. JPEG, PNG, BMP, TIFF, GIF, etc.) the placeholder object 116 can be single color images having the same height and width as the corresponding object 114. Alternately, the placeholder object 116 for an image can be an image that has been compressed using "lossy" compression.

For video files (e.g. AVI, MP4, MKV, etc.) the placeholder object 116 can be videos having the same length, width, and height as the corresponding video object 114, but showing a single color frame. Alternately, the placeholder object 116 for a video can be a video file that has been compressed using "lossy" compression.

For audio files (e.g. MP3, WAV, WMA, etc.) the placeholder object 116 can be an audio file having the same length as the corresponding audio object 114, but containing only a single frequency of audio. Alternately, the placeholder object 116 for an audio file can be an audio file that has been compressed using "lossy" compression.

For a document file (e.g. PPTX, XLSX, DOCX, VSDX, PPT, XLS, DOC, ODP, ODF, ODS, etc.) the placeholder object 116 can be a preselected "dummy" file of a small size and having the same file type as the corresponding object 114. For instance, in the case of a presentation document, a "dummy" file can be utilized that has only a single empty slide rather than the original presentation. Alternately, any media objects (e.g. videos, audios, slides, etc.) contained in the document file can be removed in order to create the placeholder object 116 for that file.

Other mechanisms can also be utilized to create placeholder objects 116 for other types of embedded objects 114. For embedded fonts, for example, a font can be selected as the placeholder object 116 that has a smaller size than the original embedded font. Similarly, for other types of embedded objects (e.g. PDF, BIN, equations, etc.), a file having the same or similar file type can be selected that has a smaller size than the original embedded object. In another configuration, a very small file having a different type than the original object 114 can be utilized as a placeholder object 116. In this configuration, however, the network service 108 might need to be modified in order for it to perform its processing on a file 106B that contains placeholder objects 116 of a different type than the corresponding embedded objects 114. Other configurations can also be utilized.

In the example shown in FIG. 1A, the application 104 uses the file 106A to create a file 106B. In the file 106B, the embedded object 114A has been replaced by the corresponding placeholder object 116A, the embedded object 114B has been replaced by the corresponding placeholder object 116B, and the embedded object has been replaced by the corresponding placeholder object 116N. Other numbers of embedded objects 114 can be replaced with a corresponding number of placeholder objects 116 in other configurations. As also shown in FIG. 1A, the application 104 can store the embedded objects 114 from the file 106A in an appropriate data store 120 for later use in the manner described below.

In one configuration, the application 104 also generates hash values 118 for the unique placeholder objects 116 utilizing a suitable hash function, such as MD5, SHA1, SHA2, or a similar function that can generate hash values from the unique placeholder objects 116. In the configuration described above, wherein the placeholder objects 116 are images having a unique color among the placeholder objects 116, each placeholder object 116 will have a unique hash value 118. The application 104 stores the hash values 118 and the original embedded objects 114 in a suitable data store 120 for later use in replacing the placeholder objects 116 in a processed version of the file 106 with the original embedded objects 114. In some configurations, the application does not store the original embedded objects 114 in a data store 120, but rather stores the file 106A and a reference to the positions of the embedded objects 114 in the file 106A. In this way, memory usage can be conserved as compared to a configuration wherein an additional copy of the embedded objects 114 is created in the data store 120.

Once the application 104 has replaced the embedded objects 114 in the file 106A with the placeholder objects 116 to create the file 106B, the application 104 compresses the file 106B using a suitable data compression algorithm. Because, in the configuration described above, the placeholder object images only include a single color, these images are very highly compressible. As a result, the compressed file 106B containing the placeholder object images 116 is much smaller in size than the original file 106A.

Consequently, the network bandwidth needed to transmit the file 106B to a remote network service 108 for format conversion, or another type of processing, can be significantly reduced.

Table 1 illustrates the size reduction obtained from application of the mechanism described above to a sampling of presentation documents. Other types of documents might result in a smaller or greater reduction in file size.

TABLE 1

| File No. | No. of Slides | No. of Images | Original Size(kb) | Optimized Size(kb) | % Bytes Saved |
|---|---|---|---|---|---|
| 1 | 1 | 0 | 83.5 | 31.4 | 62% |
| 2 | 11 | 2 | 389 | 88.1 | 77% |
| 3 | 2 | 2 | 553 | 53.3 | 90% |
| 4 | 66 | 67 | 4490 | 323 | 93% |
| 5 | 122 | 90 | 7710 | 518 | 93% |
| 6 | 47 | 67 | 10700 | 279 | 97% |

As discussed briefly above, in some configurations the file 106A is an OLE structured storage file that includes summary information, a pictures stream containing embedded images, and a document stream. In this configuration, the summary information is removed from the file 106A in order to reduce the file size even further. For example, the summary information can include a document preview image, which the application 104 can remove from the file 106A to further minimize the amount of data transmitted to and from the network service 108. In this configuration, the application 104 can also insert padding bytes into the pictures stream such that the size of each placeholder object 116 is the same as the corresponding embedded object 114 in the file 106. The padding bytes are also highly compressible. Additional details regarding this particular implementation will be provided below with regard to FIG. 3.

Once the application 104 has compressed the file 106B containing the placeholder objects 116, the application 104 transmits the compressed file 106B over a data communications network 112 to a file processing network service 108 (which might be referred to herein as a "network service") configured to generate a processed file based upon the file. For example, and without limitation, the file processing network service 108 can execute on the computing device 110 and provide functionality for converting the file 106B from one data format, such as a legacy file format for presentation documents, to another data format, such as a more modern file format for presentation documents. In this configuration, the file 106B can be included in a request 112 transmitted to the network service 108 to convert the format of the file 106B.

In other configurations, the file processing network service 108 is configured to process the file 106B in one or more other ways, such as correcting the spelling or grammar of text contained in the file 106B, making or suggesting stylistic changes to text in the file 106B, and/or other types of processing. Additional details regarding the mechanism described in FIG. 1A will be provided below with regard to FIG. 1B.

Figure 1B:
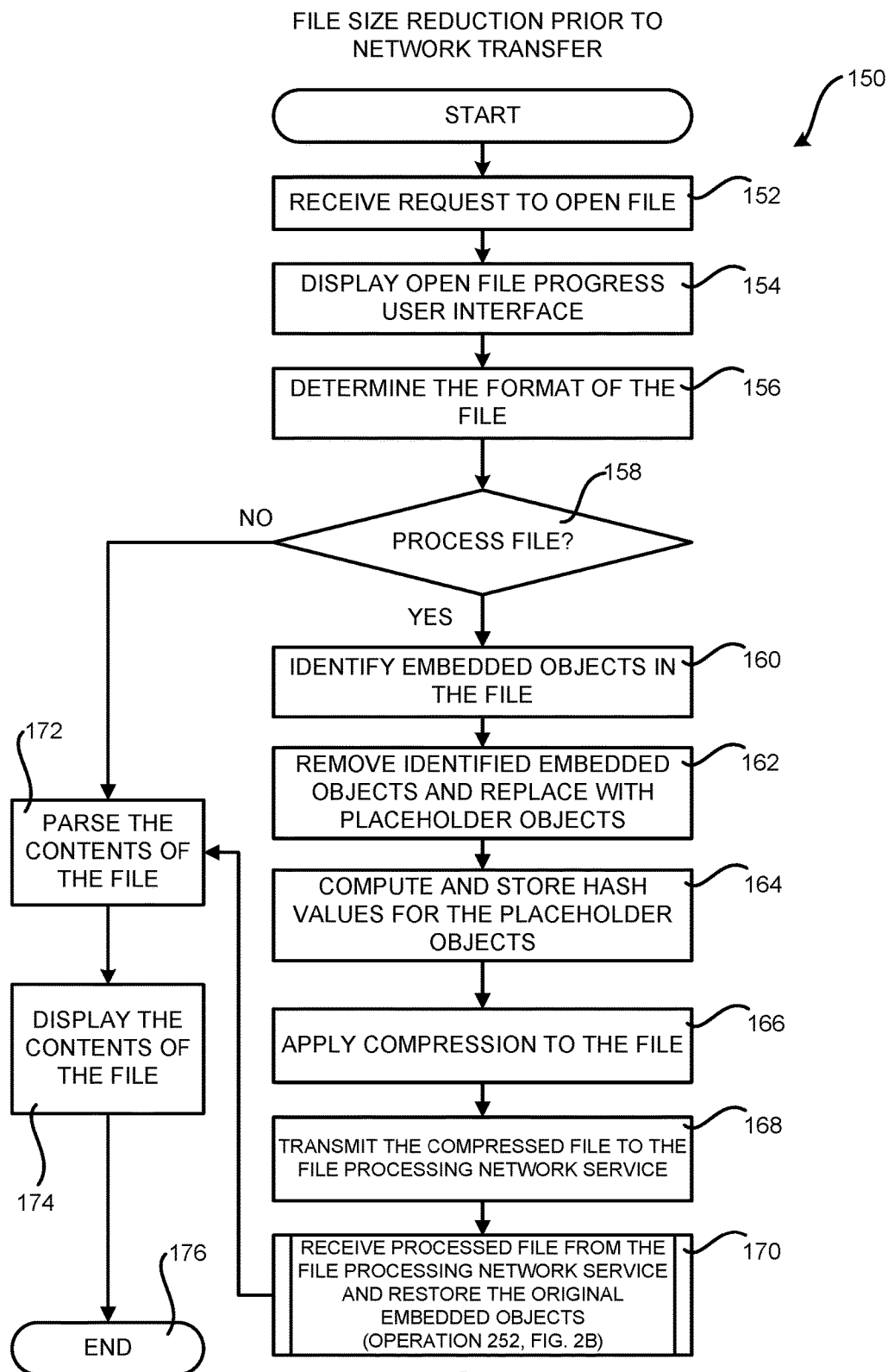
FIG. 1B is a flow diagram showing a routine that illustrates aspects of the operation of the computing device shown in FIG. 1A for reducing network bandwidth utilization by replacing embedded objects in a file with placeholder objects, according to one configuration disclosed herein.

FIG. 1B is a flow diagram showing a routine 150 that illustrates aspects of the operation of the computing device 102 shown in FIG. 1A for reducing network bandwidth utilization by replacing embedded objects 114 in a file 106A with highly compressible placeholder objects 116, according to one configuration disclosed herein. It should be appreciated that the logical operations described herein with regard to FIG. 1B and the other FIGS. can be implemented (1) as a sequence of computer implemented acts or program modules running on a computing system and/or (2) as interconnected machine logic circuits or circuit modules within the computing system.

The particular implementation of the technologies disclosed herein is a matter of choice dependent on the performance and other requirements of the computing system. Accordingly, the logical operations described herein are referred to variously as states operations, structural devices, acts, or modules. These operations, structural devices, acts and modules can be implemented in software, in firmware, in special purpose digital logic, and any combination thereof. It should also be appreciated that more or fewer operations can be performed than shown in the FIGS. and described herein. These operations can also be performed in a different order than those described herein.

The routine 150 begins at operation 152, where the application 104 receives a request to open or otherwise utilize the file 106A. In response thereto, the routine 150 proceeds to operation 154, where a suitable user interface ("UI") can be presented to the user making the request indicating that the file 106A is being opened. The routine 150 can then proceed to operation 156, where the application 104 determines the format of the file 106A. Various mechanisms can be utilized to determine the format of a file including, but not limited to, reading data from the file 106A to determine its type, examining the extension of a filename for the file 106A, and/or other mechanisms.

Once the format of the file 106A has been determined, the routine 150 proceeds to operation 158, where the application 104 determines whether the file 106A is to be processed. For example, and without limitation, the application 104 can determine whether the file 106A is expressed using a data format that is not to be opened directly on the computing device 102, but rather is to be converted by the file processing network service 108 executing on the computing device 110 prior to opening on the computing device 102.

If the file 106A is not to be processed, the routine 150 proceeds from operation 158 to operation 172, where the application 104 parses the contents of the file 106A. The routine 150 then proceeds from operation 172 to operation 174, where the application 104 displays the contents of the file 106A. The file 106A can then be edited and/or processed in various ways depending upon the particular functionality provided by the application 104. The routine 150 then proceeds from operation 174 to operation 176, where it ends.

If, at operation 158, the application 104 determines that the file 106A is to be processed prior to opening the file 106A, the routine 150 proceeds from operation 158 to operation 160. At operation 160, the application 104 identifies the embedded objects 114 in the file 106A. As discussed above, the application 104 searches the pictures stream in an OLE structured storage file in order to identify embedded images in one particular configuration. Other types of file formats and embedded objects 114 can, however, be utilized in other configurations.

From operation 160, the routine 150 proceeds to operation 162, where the application 104 removes the embedded objects 114 identified at operation 160 and replaces the embedded objects 114 with corresponding placeholder objects 116 in order to create the file 106B. As discussed above, in one particular configuration, the embedded objects 114 are images and the placeholder objects 116 are images of a single color having a height and width that is the same as the corresponding embedded object image 114. In one configuration, it might also be necessary to insert padding bytes into the file 106B to ensure that the size of the placeholder objects 116 are the same as the corresponding embedded objects 114. This aspect is described in greater detail below with regard to FIG. 3.

From operation 162, the routine 150 proceeds to operation 164, where the application 104 computes and stores the hash values 118 for the placeholder objects 116. As will be described in greater detail below with regard to FIGS. 2A and 2B, the application 104 can utilize the stored hash values 118 to match placeholder objects 116 with the corresponding original embedded object 114 in some configurations.

From operation 164, the routine 150 proceeds to operation 166, where the application 104 can apply data compression to the file 106B containing the placeholder objects 116. For example, in one particular implementation, the application 104 applies the ZIP compression algorithm to the file 106B. Other compression algorithms can be utilized in other configurations.

As discussed briefly above, in one particular configuration, lossless compression is utilized to compress the file 106B and the placeholder objects 116 contained therein. This implementation is appropriate where, for instance, the network service 108 requires full fidelity placeholder objects 116 in order to perform its processing. In another configuration, "lossy" compression is utilized to compress the placeholder objects 116 prior to transmission to the network service 108. This implementation can be utilized where, for example, the network service 108 does not require the placeholder objects 116 to be full fidelity in order to perform its processing. The utilization of lossy compression on the placeholder objects 116 can lead to significantly smaller file sizes than lossless compression. Combinations of lossy and lossless compress techniques can also be utilized in other configurations as appropriate.

In configurations where the application 104 compresses the file 106B containing the placeholder objects 116 prior to transmission to the file processing network service 108, the file processing network service 108 can be configured to decompress the file 106B when received and prior to performing its processing on the file. The file processing network service 108 can also be configured to compress the processed file 204A prior to transmitting the processed file 204A to the application 104. When the application 104 receives the processed file 204A, the application 104 can decompress the file 204A prior to replacing the placeholder objects 116 with the embedded objects 114 in the manner described below.

From operation 166, the routine 150 proceeds to operation 168, where the application 104 transmits the compressed file 106B containing the placeholder objects 116 to the file processing network service 108 over the network 112. For example, and as discussed briefly above, the application 104 can transmit a request 122 that includes the file 106B to the network service 108.

As will be described in greater detail below, the network service 108 processes the file 106B, such as by converting the file 106B between file formats, and returns a processed file to the application 104. The application 104 then receives the processed file at operation 170 and replaces the placeholder objects 116 in the processed file with the original embedded objects 114. Additional details regarding this process will be provided below with regard to FIGS. 2A and 2B. From operation 170, the routine 150 proceeds to operations 172 and 174 where the processed file can be parsed and displayed in the manner described above. The processed file received back from the network service 108 can also be processed in other ways in other configurations.

Figure 2A:
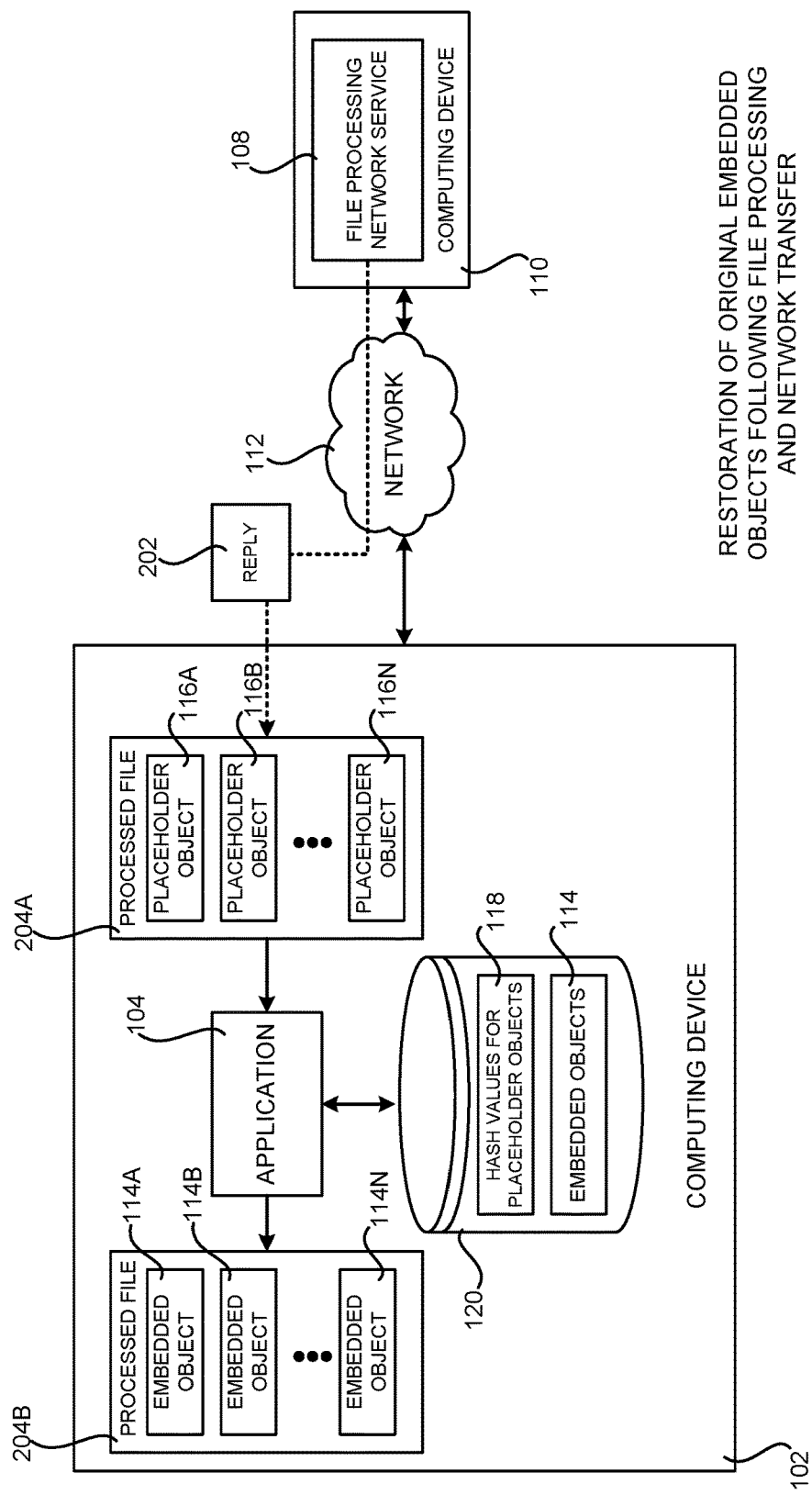
FIG. 2A is a computer system architecture diagram showing additional aspects of the configuration and operation of the computing device shown in FIG. 1A for replacing placeholder objects with original embedded objects in a processed file, according to one configuration disclosed herein.

FIG. 2A is a computer system architecture diagram showing additional aspects of the configuration and operation of the computing device 102 shown in FIG. 1A for replacing placeholder objects 116 with corresponding original embedded objects 114 in a processed file 204A, according to one configuration disclosed herein. As shown in FIG. 2A, once the network service 108 has completed its processing of the file 106A, the network service provides the processed file 204A, which includes the placeholder objects 116, to the application 104.

For example, and without limitation, the network service 108 can transmit the processed file 204A to the application 120 over the network 112 as a reply 202 to the original request 122. Because the processed file 204A includes the placeholder objects 116 rather than the original embedded objects 114, the network bandwidth required to transmit the processed file 204A to the application 104 over the network 112 is significantly reduced as compared to transmitting a file that includes the original embedded objects 114.

The application 104 receives the processed file 204A from the network service 108 and replaces each unique placeholder object 116 in the processed file 204A with its corresponding original embedded object 114. For example, in one particular configuration, the application 104 utilizes the previously generated and stored hash values 118 for the unique placeholder objects 116 to identify the corresponding embedded objects 114 from the original file 106A.

The application 104 then replaces each unique placeholder object 116 with its corresponding embedded object 114 to create the processed file 104B. The application 104 can then open the processed file 104B for editing, viewing, and/or other purposes. Additional details regarding the mechanism illustrated in FIG. 2A will be provided below with regard to FIG. 2B.

Figure 2B:
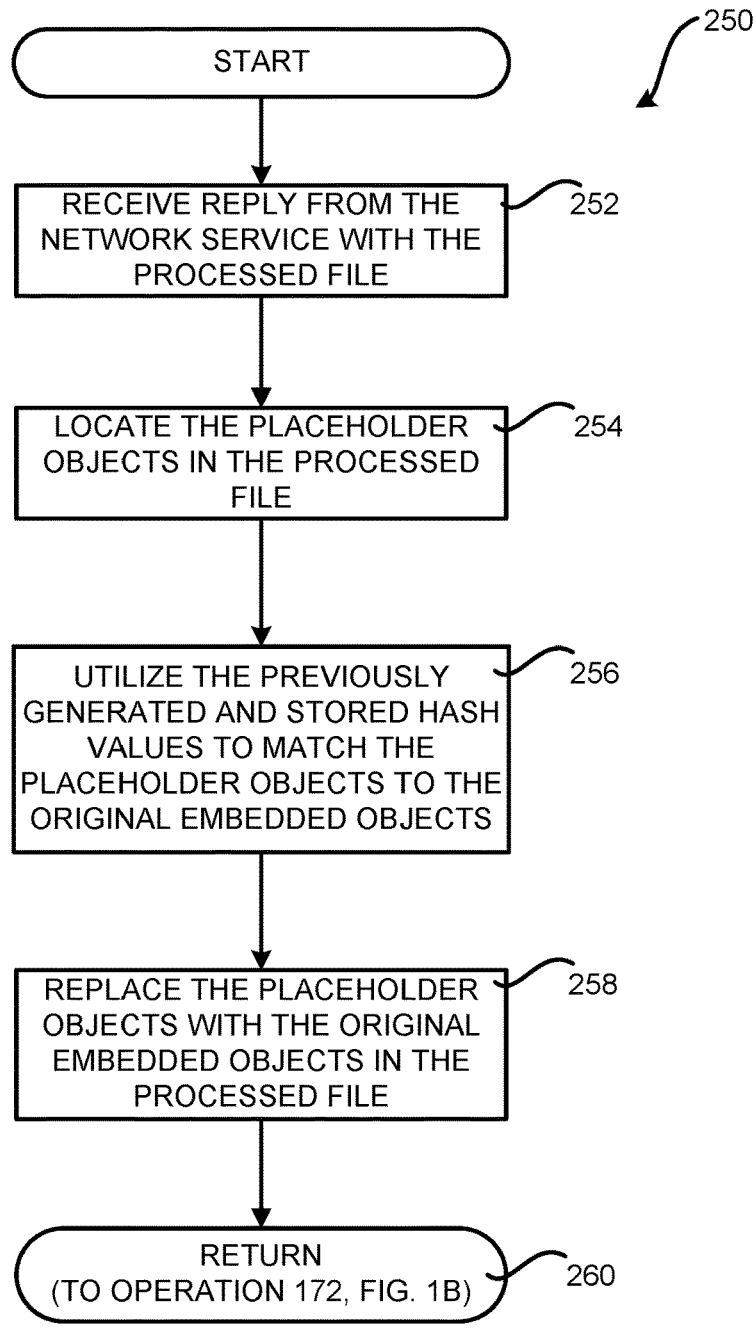
FIG. 2B is a flow diagram showing a routine that illustrates aspects of the operation of the computing device shown in FIG. 1A for replacing placeholder objects with original embedded objects in a processed file, according to one configuration disclosed herein.

FIG. 2B is a flow diagram showing a routine 250 that illustrates aspects of the operation of the computing device 102 shown in FIG. 1A for replacing placeholder objects 116 with corresponding original embedded objects 114 in a processed file 204A, according to one configuration disclosed herein. The routine 250 begins at operation 252, where the application 104 receives a reply 202 to the request 122 transmitted to the network service 108. As mentioned above, the reply 202 includes the processed file 204A, including the placeholder objects 116. From operation 252, the routine 200 proceeds to operation 254.

At operation 254, the application 104 locates the placeholder objects 116 in the processed file 204A. Once the placeholder objects 116 in the processed file 204A have been identified, the routine 250 proceeds to operation 256, where the application 104 replaces the placeholder objects 116 in the processed file 204A with the corresponding original embedded objects 114. For example, and without limitation, the application 104 can utilize the previously generated and stored hash values 118 to match the placeholder objects 116 to the corresponding embedded object 114. The placeholder objects 116 can then be replaced with the corresponding embedded objects 114 to create the processed file 204B. The routine 250 then proceeds to operation 260, where it returns to operation 172 discussed above with regard to the routine 150.

Figure 3:
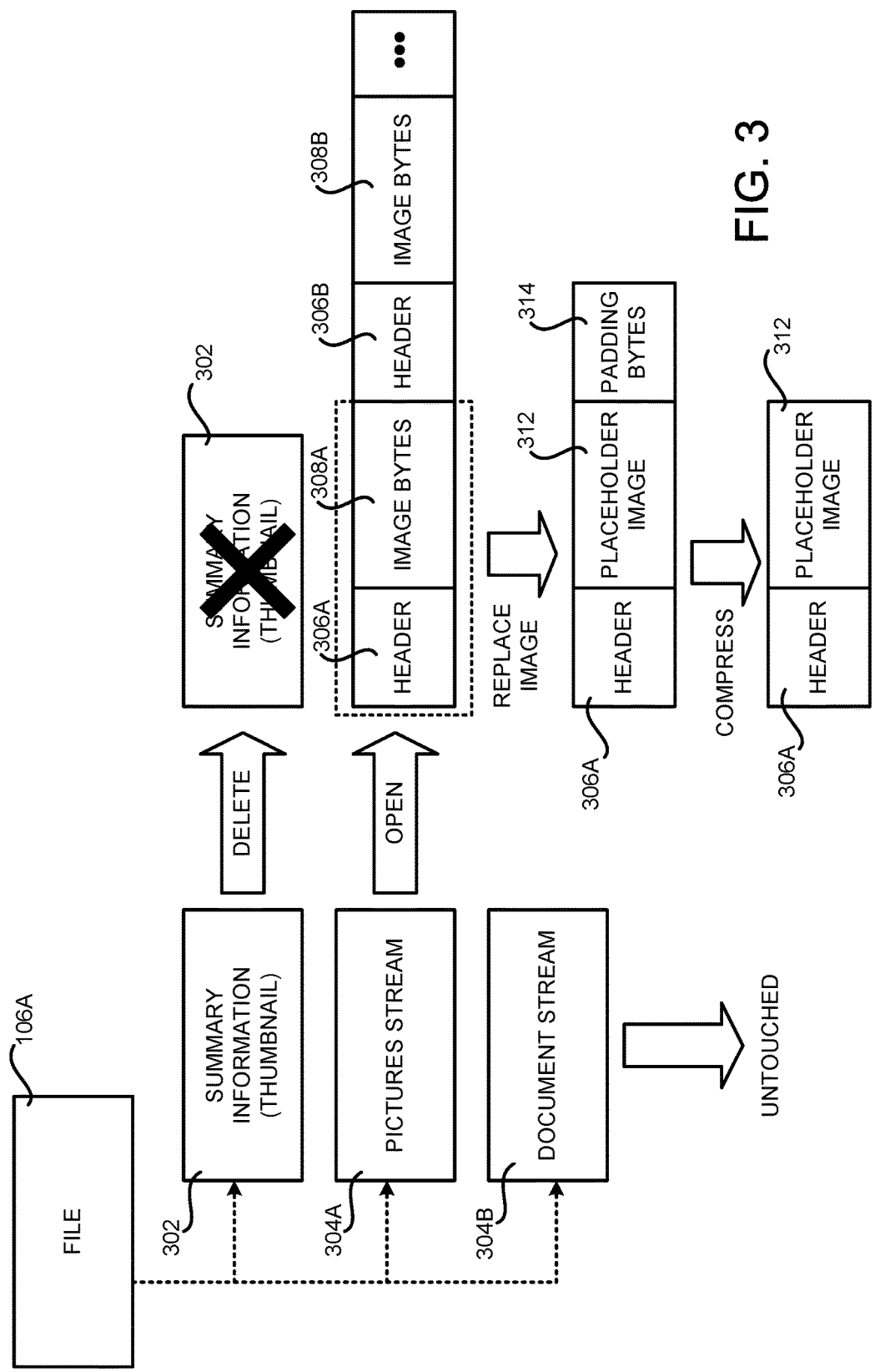
FIG. 3 is a data format and process diagram illustrating additional aspects of configuration and operation of the technologies disclosed herein when utilized with an object linking and embedding ("OLE") structured storage file, according to one configuration disclosed herein.

FIG. 3 is a data format and process diagram illustrating additional aspects of configuration and operation of the technologies disclosed herein when utilized with an OLE structured storage file, such as a presentation file formatted according to the PPT file format, according to one configuration disclosed herein. As discussed above, in some configurations the file 106A is an OLE structured storage file. In these configurations, the file 106A includes summary information 302, a pictures stream 304A, and a document stream 304B.

The summary information 302 can include a thumbnail preview image for the file 106A. In this configuration, the summary information 302 can be deleted prior to transmitting the file 106B to the network service 108, thereby reducing the size of the file 106B and the network bandwidth required to transmit the file 106B even further.

As also mentioned above, the pictures stream 304A includes a stream of images. Each of the images in the pictures stream 304A is represented by a header (e.g. the headers 306A and 306B), and the image bytes that make up the actual images (e.g. image bytes 308A and 308N). In this example, the headers 306 are not changed. The image bytes 308 are, however, replaced by the corresponding placeholder image 312. Additionally, if necessary, highly compressible padding bytes 314 can be added to ensure that the size of the placeholder images is exactly the same as the original embedded image when compressed.

As shown in FIG. 3 and mentioned briefly above, the file 106A also includes a document stream 304B. The document stream 304B can include data describing other aspects of the file 106A. Because the document stream 304B is often complex and can require full parsing prior to alteration, the document stream 304B is not altered by the application 104 prior to transmitting the file 106B to the network service 108 for processing. It should be appreciated that while an OLE structured storage file 106A is shown in FIG. 3 and described above, other file formats can be utilized in other configurations.

It should be appreciated that while the configurations disclosed herein are primarily presented in the context of replacing embedded images with corresponding placeholder objects, the technologies disclosed herein can be utilized with other types of embedded objects in a similar fashion. For example, and without limitation, the technologies disclosed herein can be utilized with videos, audio files, and/or other types of objects, some of which have been described above, that have been embedded in a file.

Figure 4:
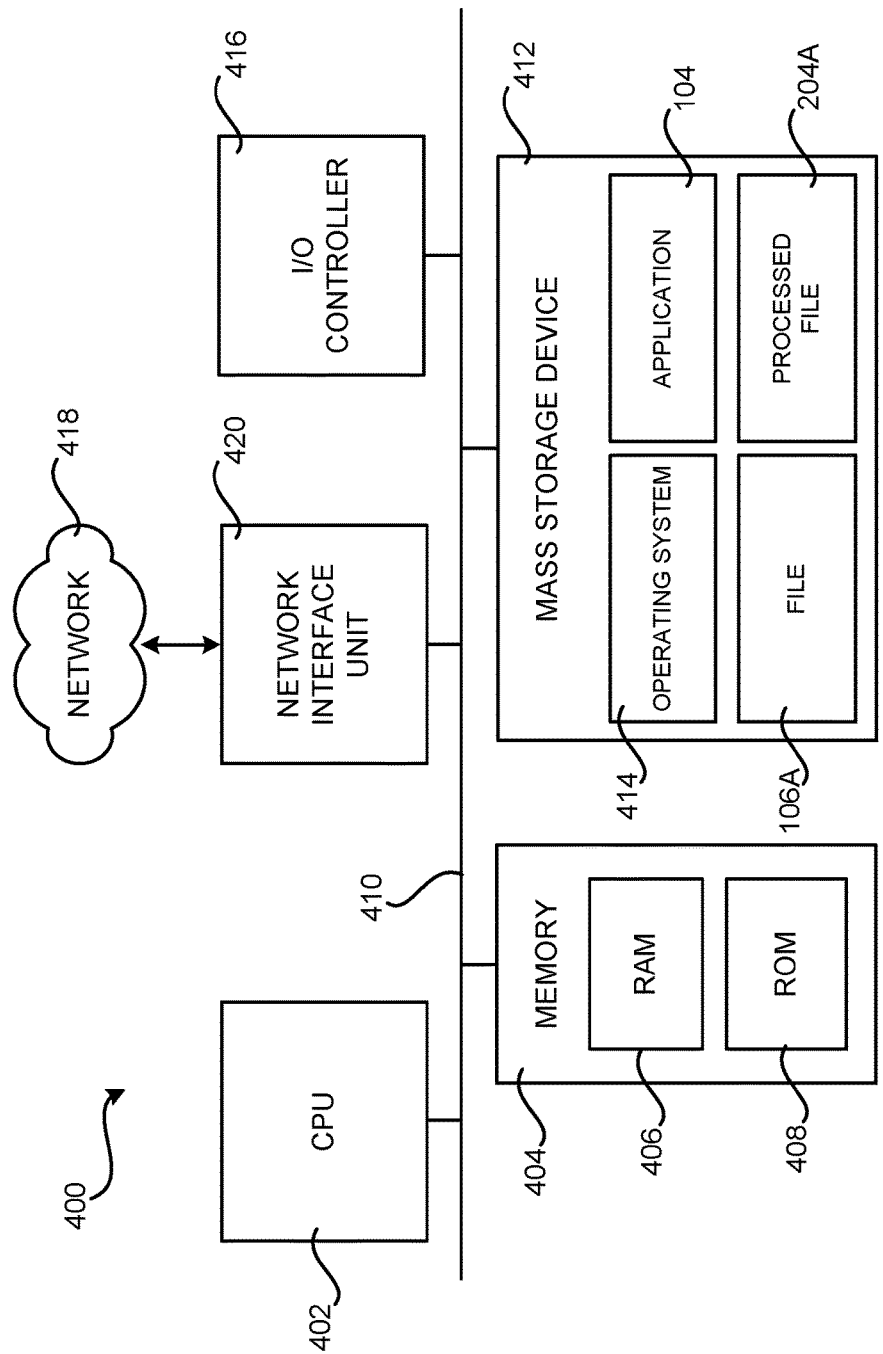
FIG. 4 is a computer architecture diagram illustrating an illustrative computer hardware and software architecture for a computing system, such as the computing device shown in FIG. 1A, that is capable of implementing aspects of the technologies presented herein.

FIG. 4 is a computer architecture diagram that shows an architecture for a computer 400 capable of executing the software components described herein. The architecture illustrated in FIG. 4 is an architecture for a server computer, mobile phone, an e-reader, a smart phone, a desktop computer, a netbook computer, a tablet computer, a laptop computer, or another type of computing device suitable for executing the software components presented herein.

In this regard, it should be appreciated that the computer 400 shown in FIG. 4 can be utilized to implement a computing device capable of executing any of the software components presented herein. For example, and without limitation, the computing architecture described with reference to the computer 400 can be utilized to implement the computing devices 102 and 110, illustrated in FIGS. 1A and 1B and described above, which are capable of executing the application 104 and the file processing network service 108, respectively, and/or any of the other software components described above.

The computer 400 illustrated in FIG. 4 includes a central processing unit 402 ("CPU"), a system memory 404, including a random access memory 406 ("RAM") and a read-only memory ("ROM") 408, and a system bus 410 that couples the memory 404 to the CPU 402. A basic input/output system containing the basic routines that help to transfer information between elements within the computer 400, such as during startup, is stored in the ROM 408. The computer 400 further includes a mass storage device 412 for storing an operating system 414 and one or more programs including, but not limited to the application 104. The mass storage device 412 can also be configured to store other types of programs and data, such as the file 106A and the processed file 204A.

The mass storage device 412 is connected to the CPU 402 through a mass storage controller (not shown) connected to the bus 410. The mass storage device 412 and its associated computer readable media provide non-volatile storage for the computer 400. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 400.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 400. For purposes of the claims, the phrase "computer storage medium," and variations thereof, does not include waves or signals per se or communication media.

According to various configurations, the computer 400 can operate in a networked environment using logical connections to remote computers through a network such as the network 418. The computer 400 can connect to the network 418 through a network interface unit 420 connected to the bus 410. It should be appreciated that the network interface unit 420 can also be utilized to connect to other types of networks and remote computer systems. The computer 400 can also include an input/output controller 416 for receiving and processing input from a number of other devices, including a keyboard, mouse, touch input, or electronic stylus (not shown in FIG. 4). Similarly, the input/output controller 416 can provide output to a display screen, a printer, or other type of output device (also not shown in FIG. 4).

It should be appreciated that the software components described herein, such as the application 104, can, when loaded into the CPU 402 and executed, transform the CPU 402 and the overall computer 400 from a general-purpose computing system into a special-purpose computing system customized to facilitate the functionality presented herein.

The CPU 402 can be constructed from any number of transistors or other discrete circuit elements, which can individually or collectively assume any number of states. More specifically, the CPU 402 can operate as a finite-state machine, in response to executable instructions contained within the software modules disclosed herein, such as the application 104. These computer-executable instructions can transform the CPU 402 by specifying how the CPU 402 transitions between states, thereby transforming the transistors or other discrete hardware elements constituting the CPU 402.

Encoding the software modules presented herein, such as the application 104, can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 400 in order to store and execute the software components presented herein. It also should be appreciated that the architecture shown in FIG. 4 for the computer 400, or a similar architecture, can be utilized to implement other types of computing devices, including hand-held computers, embedded computer systems, mobile devices such as smartphones and tablets, and other types of computing devices known to those skilled in the art. It is also contemplated that the computer 400 might not include all of the components shown in FIG. 4, can include other components that are not explicitly shown in FIG. 4, or can utilize an architecture completely different than that shown in FIG. 4.

Figure 5:
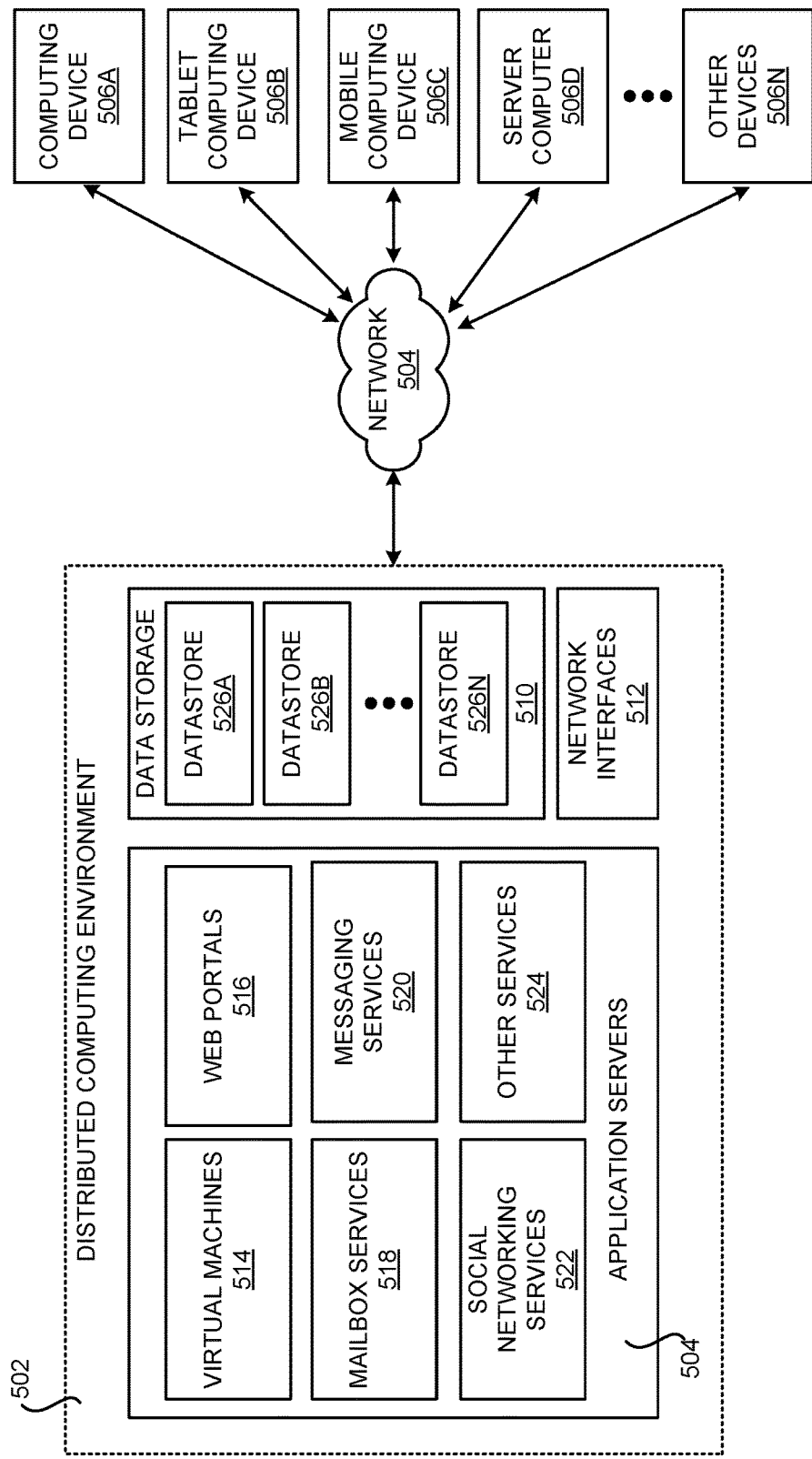
FIG. 5 is a diagram illustrating a distributed computing environment capable of implementing aspects of the technologies presented herein.

FIG. 5 shows aspects of an illustrative distributed computing environment 502 in which the software components described herein can be executed. Thus, the distributed computing environment 502 illustrated in FIG. 5 can be used to execute program code, such as the application 102 and the file processing network service 108, capable of providing the functionality described herein with respect to FIGS. 1A-4, and/or any of the other software components described herein.

According to various implementations, the distributed computing environment 502 operates on, in communication with, or as part of a network 504. One or more client devices 506A-506N (hereinafter referred to collectively and/or generically as "clients 506") can communicate with the distributed computing environment 502 via the network 504 and/or other connections (not illustrated in FIG. 5).

In the illustrated configuration, the clients 506 include: a computing device 506A such as a laptop computer, a desktop computer, or other computing device; a "slate" or tablet computing device ("tablet computing device") 506B; a mobile computing device 506C such as a mobile telephone, a smart phone, or other mobile computing device; a server computer 506D; and/or other devices 506N. It should be understood that any number of clients 506 can communicate with the distributed computing environment 502. Two example computing architectures for the clients 506 are illustrated and described herein with reference to FIGS. 4 and 6. It should be understood that the illustrated clients 506 and computing architectures illustrated and described herein are illustrative, and should not be construed as being limited in any way.

In the illustrated configuration, the distributed computing environment 502 includes application servers 504, data storage 510, and one or more network interfaces 512. According to various implementations, the functionality of the application servers 504 can be provided by one or more server computers that are executing as part of, or in communication with, the network 504. The application servers 504 can host various services such as the file processing network service 108 described above, virtual machines, portals, and/or other resources. In the illustrated configuration, the application servers 504 host one or more virtual machines 514 for hosting applications, such as the application 104, or other functionality. According to various implementations, the virtual machines 514 host one or more applications and/or software modules, such as the application 104. It should be understood that this configuration is illustrative, and should not be construed as being limiting in any way. The application servers 504 might also host or provide access to one or more Web portals, link pages, Web sites, and/or other information ("Web portals") 516.

According to various implementations, the application servers 504 also include one or more mailbox services 518 and one or more messaging services 520. The mailbox services 518 can include electronic mail ("email") services. The mailbox services 518 can also include various personal information management ("PIM") services including, but not limited to, calendar services, contact management services, collaboration services, and/or other services. The messaging services 520 can include, but are not limited to, instant messaging ("IM") services, chat services, forum services, and/or other communication services.

The application servers 504 can also include one or more social networking services 522. The social networking services 522 can provide various types of social networking services including, but not limited to, services for sharing or posting status updates, instant messages, links, photos, videos, and/or other information, services for commenting or displaying interest in articles, products, blogs, or other resources, and/or other services. In some configurations, the social networking services 522 are provided by or include the FACEBOOK social networking service, the LINKEDIN professional networking service, the MYSPACE social networking service, the FOURSQUARE geographic networking service, the YAMMER office colleague networking service, and the like. In other configurations, the social networking services 522 are provided by other services, sites, and/or providers that might be referred to as "social networking providers." For example, some Web sites allow users to interact with one another via email, chat services, and/or other means during various activities and/or contexts such as reading published articles, commenting on goods or services, publishing, collaboration, gaming, and the like. Other services are possible and are contemplated.

The social networking services 522 can also include commenting, blogging, and/or microblogging services. Examples of such services include, but are not limited to, the YELP commenting service, the KUDZU review service, the OFFICETALK enterprise microblogging service, the TWITTER messaging service, the GOOGLE BUZZ service, and/or other services. It should be appreciated that the above lists of services are not exhaustive and that numerous additional and/or alternative social networking services 522 are not mentioned herein for the sake of brevity. As such, the configurations described above are illustrative, and should not be construed as being limited in any way.

As also shown in FIG. 5, the application servers 504 can also host other services, applications, portals, and/or other resources ("other services") 524. The other services 524 can include, but are not limited to, the file processing network service 108, and/or any of the other software components described herein. It thus can be appreciated that the distributed computing environment 502 can provide integration of the concepts and technologies disclosed herein provided herein with various mailbox, messaging, social networking, productivity, conversion, and/or other types of services or resources.

As mentioned above, the distributed computing environment 502 can include data storage 510. According to various implementations, the functionality of the data storage 510 is provided by one or more databases operating on, or in communication with, the network 504. The functionality of the data storage 510 can also be provided by one or more server computers configured to host data for the distributed computing environment 502. The data storage 510 can include, host, or provide one or more real or virtual datastores 526A-526N (hereinafter referred to collectively and/or generically as "datastores 526"). The datastores 526 are configured to host data used or created by the application servers 504 and/or other data.

The distributed computing environment 502 can communicate with, or be accessed by, the network interfaces 512. The network interfaces 512 can include various types of network hardware and software for supporting communications between two or more computing devices including, but not limited to, the clients 506 and the application servers 504. It should be appreciated that the network interfaces 512 can also be utilized to connect to other types of networks and/or computer systems.

It should be understood that the distributed computing environment 502 described herein can implement any aspects of the software elements described herein with any number of virtual computing resources and/or other distributed computing functionality that can be configured to execute any aspects of the software components disclosed herein. According to various implementations of the concepts and technologies disclosed herein, the distributed computing environment 502 provides some or all of the software functionality described herein as a service to the clients 506. It should be understood that the clients 506 can also include real or virtual machines including, but not limited to, server computers, Web servers, personal computers, mobile computing devices, smart phones, and/or other devices. As such, various implementations of the concepts and technologies disclosed herein enable any device configured to access the distributed computing environment 502 to utilize the functionality described herein.

Figure 6:
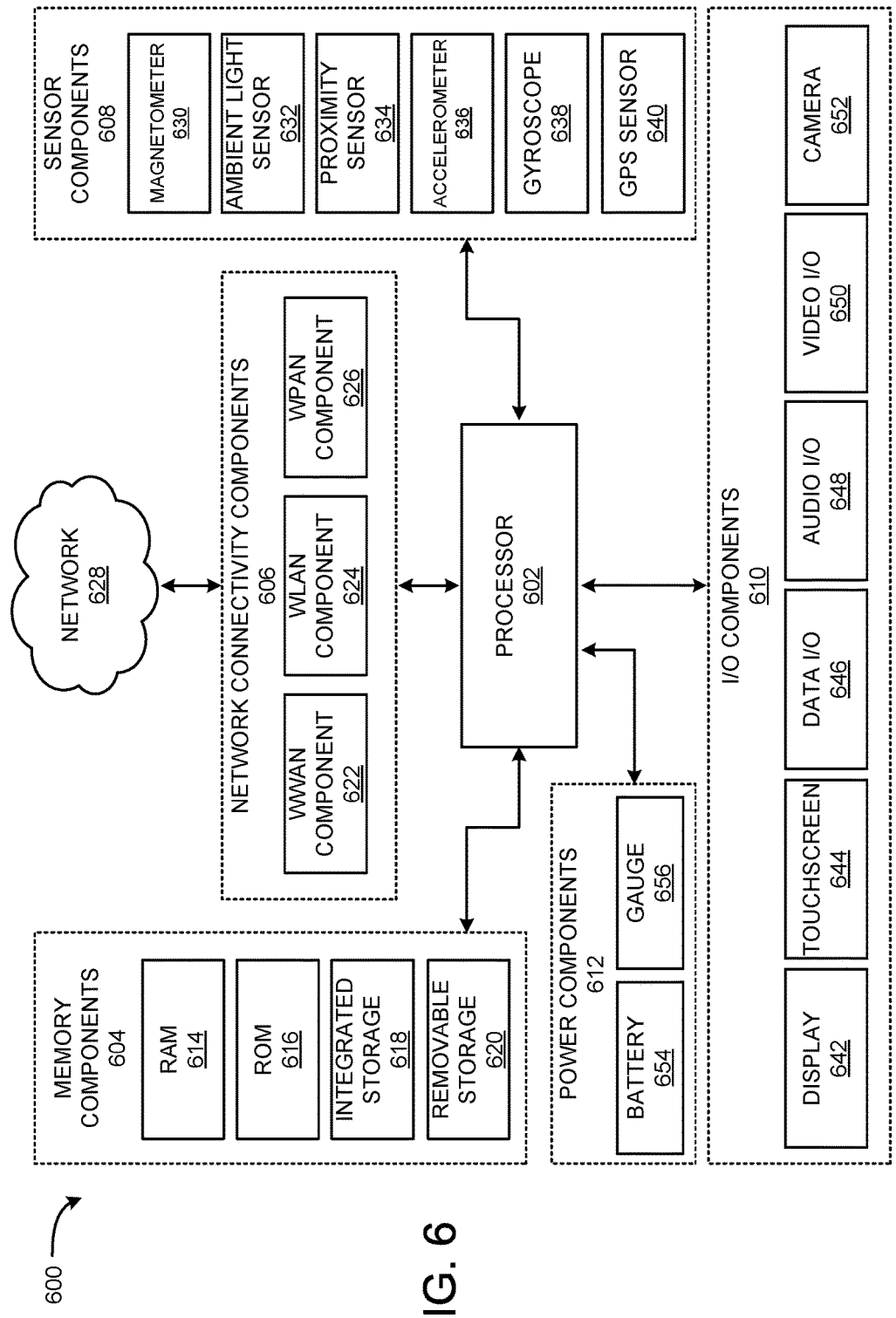
FIG. 6 is a computer architecture diagram illustrating a computing device architecture for a computing device, such as the computing device shown in FIG. 1A, that is capable of implementing aspects of the technologies presented herein.

Turning now to FIG. 6, an illustrative computing device architecture 600 will be described for a computing device, such as the computing device 102 or the computing device 110, that is capable of executing the various software components described herein. The computing device architecture 600 is applicable to computing devices that facilitate mobile computing due, in part, to form factor, wireless connectivity, and/or battery-powered operation. In some configurations, the computing devices include, but are not limited to, mobile telephones, tablet devices, slate devices, portable video game devices, and the like.

The computing device architecture 600 is also applicable to any of the clients 506 shown in FIG. 5. Furthermore, aspects of the computing device architecture 600 are applicable to traditional desktop computers, portable computers (e.g., laptops, notebooks, ultra-portables, and netbooks), server computers, and other computer systems, such as described herein with reference to FIG. 6. For example, the single touch and multi-touch aspects disclosed herein below can be applied to desktop computers that utilize a touchscreen or some other touch-enabled device, such as a touch-enabled track pad or touch-enabled mouse. The computing device architecture 600 can also be utilized to implement the computing device 102, the computing device 110, and/or other types of computing devices for implementing or consuming the functionality described herein.

The computing device architecture 600 illustrated in FIG. 6 includes a processor 602, memory components 604, network connectivity components 606, sensor components 608, input/output components 610, and power components 612. In the illustrated configuration, the processor 602 is in communication with the memory components 604, the network connectivity components 606, the sensor components 608, the input/output ("I/O") components 610, and the power components 612. Although no connections are shown between the individual components illustrated in FIG. 6, the components can be connected electrically in order to interact and carry out device functions. In some configurations, the components are arranged so as to communicate via one or more busses (not shown).

The processor 602 includes one or more central processing unit ("CPU") cores configured to process data, execute computer-executable instructions of one or more application programs, such as the application 104, and to communicate with other components of the computing device architecture 600 in order to perform various functionality described herein. The processor 602 can be utilized to execute aspects of the software components presented herein and, particularly, those that utilize, at least in part, a touch-enabled input.

In some configurations, the processor 602 includes a graphics processing unit ("GPU") configured to accelerate operations performed by the CPU, including, but not limited to, operations performed by executing general-purpose scientific and engineering computing applications, as well as graphics-intensive computing applications such as high resolution video (e.g., 720P, 1080P, 4K, and greater), video games, 3D modeling applications, and the like. In some configurations, the processor 602 is configured to communicate with a discrete GPU (not shown). In any case, the CPU and GPU can be configured in accordance with a co-processing CPU/GPU computing model, wherein the sequential part of an application executes on the CPU and the computationally intensive part is accelerated by the GPU.

In some configurations, the processor 602 is, or is included in, a system-on-chip ("SoC") along with one or more of the other components described herein below. For example, the SoC can include the processor 602, a GPU, one or more of the network connectivity components 606, and one or more of the sensor components 608. In some configurations, the processor 602 is fabricated, in part, utilizing a package-on-package ("PoP") integrated circuit packaging technique. Moreover, the processor 602 can be a single core or multi-core processor.

The processor 602 can be created in accordance with an ARM architecture, available for license from ARM HOLDINGS of Cambridge, United Kingdom. Alternatively, the processor 602 can be created in accordance with an x86 architecture, such as is available from INTEL CORPORATION of Mountain View, Calif. and others. In some configurations, the processor 602 is a SNAPDRAGON SoC, available from QUALCOMM of San Diego, Calif., a TEGRA SoC, available from NVIDIA of Santa Clara, Calif., a HUMMINGBIRD SoC, available from SAMSUNG of Seoul, South Korea, an Open Multimedia Application Platform ("OMAP") SoC, available from TEXAS INSTRUMENTS of Dallas, Tex., a customized version of any of the above SoCs, or a proprietary SoC.

The memory components 604 include a RAM 614, a ROM 616, an integrated storage memory ("integrated storage") 618, and a removable storage memory ("removable storage") 620. In some configurations, the RAM 614 or a portion thereof, the ROM 616 or a portion thereof, and/or some combination the RAM 614 and the ROM 616 is integrated in the processor 602. In some configurations, the ROM 616 is configured to store a firmware, an operating system or a portion thereof (e.g., operating system kernel), and/or a bootloader to load an operating system kernel from the integrated storage 618 or the removable storage 620.

The integrated storage 618 can include a solid-state memory, a hard disk, or a combination of solid-state memory and a hard disk. The integrated storage 618 can be soldered or otherwise connected to a logic board upon which the processor 602 and other components described herein might also be connected. As such, the integrated storage 618 is integrated in the computing device. The integrated storage 618 can be configured to store an operating system or portions thereof, application programs, data, and other software components described herein.

The removable storage 620 can include a solid-state memory, a hard disk, or a combination of solid-state memory and a hard disk. In some configurations, the removable storage 620 is provided in lieu of the integrated storage 618. In other configurations, the removable storage 620 is provided as additional optional storage. In some configurations, the removable storage 620 is logically combined with the integrated storage 618 such that the total available storage is made available and shown to a user as a total combined capacity of the integrated storage 618 and the removable storage 620.

The removable storage 620 is configured to be inserted into a removable storage memory slot (not shown) or other mechanism by which the removable storage 620 is inserted and secured to facilitate a connection over which the removable storage 620 can communicate with other components of the computing device, such as the processor 602. The removable storage 620 can be embodied in various memory card formats including, but not limited to, PC card, COMPACTFLASH card, memory stick, secure digital ("SD"), miniSD, microSD, universal integrated circuit card ("UICC") (e.g., a subscriber identity module ("SIM") or universal SIM ("USIM")), a proprietary format, or the like.

It can be understood that one or more of the memory components 604 can store an operating system. According to various configurations, the operating system includes, but is not limited to, the WINDOWS MOBILE OS, the WINDOWS PHONE OS, or the WINDOWS OS from MICROSOFT CORPORATION, BLACKBERRY OS from RESEARCH IN MOTION, LTD. of Waterloo, Ontario, Canada, IOS from APPLE INC. of Cupertino, Calif., and ANDROID OS from GOOGLE, INC. of Mountain View, Calif. Other operating systems are contemplated.

The network connectivity components 606 include a wireless wide area network component ("WWAN component") 622, a wireless local area network component ("WLAN component") 624, and a wireless personal area network component ("WPAN component") 626. The network connectivity components 606 facilitate communications to and from a network 628, which can be a WWAN, a WLAN, or a WPAN. Although a single network 628 is illustrated, the network connectivity components 606 can facilitate simultaneous communication with multiple networks. For example, the network connectivity components 606 can facilitate simultaneous communications with multiple networks via one or more of a WWAN, a WLAN, or a WPAN.

The network 628 can be a WWAN, such as a mobile telecommunications network utilizing one or more mobile telecommunications technologies to provide voice and/or data services to a computing device utilizing the computing device architecture 600 via the WWAN component 622. The mobile telecommunications technologies can include, but are not limited to, Global System for Mobile communications ("GSM"), Code Division Multiple Access ("CDMA") ONE, CDMA2000, Universal Mobile Telecommunications System ("UMTS"), Long Term Evolution ("LTE"), and Worldwide Interoperability for Microwave Access ("WiMAX").

Moreover, the network 628 can utilize various channel access methods (which might or might not be used by the aforementioned standards) including, but not limited to, Time Division Multiple Access ("TDMA"), Frequency Division Multiple Access ("FDMA"), CDMA, wideband CDMA ("W-CDMA"), Orthogonal Frequency Division Multiplexing ("OFDM"), Space Division Multiple Access ("SDMA"), and the like. Data communications can be provided using General Packet Radio Service ("GPRS"), Enhanced Data rates for Global Evolution ("EDGE"), the High-Speed Packet Access ("HSPA") protocol family including High-Speed Downlink Packet Access ("HSDPA"), Enhanced Uplink ("EUL") or otherwise termed High-Speed Uplink Packet Access ("HSUPA"), Evolved HSPA ("HSPA+"), LTE, and various other current and future wireless data access standards. The network 628 can be configured to provide voice and/or data communications with any combination of the above technologies. The network 628 can be configured to or adapted to provide voice and/or data communications in accordance with future generation technologies.

In some configurations, the WWAN component 622 is configured to provide dual-multi-mode connectivity to the network 628. For example, the WWAN component 622 can be configured to provide connectivity to the network 628, wherein the network 628 provides service via GSM and UMTS technologies, or via some other combination of technologies. Alternatively, multiple WWAN components 622 can be utilized to perform such functionality, and/or provide additional functionality to support other non-compatible technologies (i.e., incapable of being supported by a single WWAN component). The WWAN component 622 can facilitate similar connectivity to multiple networks (e.g., a UMTS network and an LTE network).

The network 628 can be a WLAN operating in accordance with one or more Institute of Electrical and Electronic Engineers ("IEEE") 104.11 standards, such as IEEE 104.11a, 104.11b, 104.11g, 104.11n, and/or a future 104.11 standard (referred to herein collectively as WI-FI). Draft 104.11 standards are also contemplated. In some configurations, the WLAN is implemented utilizing one or more wireless WI-FI access points. In some configurations, one or more of the wireless WI-FI access points are another computing device with connectivity to a WWAN that are functioning as a WI-FI hotspot. The WLAN component 624 is configured to connect to the network 628 via the WI-FI access points. Such connections can be secured via various encryption technologies including, but not limited, WI-FI Protected Access ("WPA"), WPA2, Wired Equivalent Privacy ("WEP"), and the like.

The network 628 can be a WPAN operating in accordance with Infrared Data Association ("IrDA"), BLUETOOTH, wireless Universal Serial Bus ("USB"), Z-Wave, ZIGBEE, or some other short-range wireless technology. In some configurations, the WPAN component 626 is configured to facilitate communications with other devices, such as peripherals, computers, or other computing devices via the WPAN.

The sensor components 608 include a magnetometer 630, an ambient light sensor 632, a proximity sensor 634, an accelerometer 636, a gyroscope 638, and a Global Positioning System sensor ("GPS sensor") 640. It is contemplated that other sensors, such as, but not limited to, temperature sensors or shock detection sensors, might also be incorporated in the computing device architecture 600.

The magnetometer 630 is configured to measure the strength and direction of a magnetic field. In some configurations the magnetometer 630 provides measurements to a compass application program stored within one of the memory components 604 in order to provide a user with accurate directions in a frame of reference including the cardinal directions, north, south, east, and west. Similar measurements can be provided to a navigation application program that includes a compass component. Other uses of measurements obtained by the magnetometer 630 are contemplated.

The ambient light sensor 632 is configured to measure ambient light. In some configurations, the ambient light sensor 632 provides measurements to an application program stored within one the memory components 604 in order to automatically adjust the brightness of a display (described below) to compensate for low light and bright light environments. Other uses of measurements obtained by the ambient light sensor 632 are contemplated.

The proximity sensor 634 is configured to detect the presence of an object or thing in proximity to the computing device without direct contact. In some configurations, the proximity sensor 634 detects the presence of a user's body (e.g., the user's face) and provides this information to an application program stored within one of the memory components 604 that utilizes the proximity information to enable or disable some functionality of the computing device. For example, a telephone application program can automatically disable a touchscreen (described below) in response to receiving the proximity information so that the user's face does not inadvertently end a call or enable/disable other functionality within the telephone application program during the call. Other uses of proximity as detected by the proximity sensor 634 are contemplated.

The accelerometer 636 is configured to measure proper acceleration. In some configurations, output from the accelerometer 636 is used by an application program as an input mechanism to control some functionality of the application program. In some configurations, output from the accelerometer 636 is provided to an application program for use in switching between landscape and portrait modes, calculating coordinate acceleration, or detecting a fall. Other uses of the accelerometer 636 are contemplated.

The gyroscope 638 is configured to measure and maintain orientation. In some configurations, output from the gyroscope 638 is used by an application program as an input mechanism to control some functionality of the application program. For example, the gyroscope 638 can be used for accurate recognition of movement within a 3D environment of a video game application or some other application. In some configurations, an application program utilizes output from the gyroscope 638 and the accelerometer 636 to enhance control of some functionality of the application 104. Other uses of the gyroscope 638 are contemplated.

The GPS sensor 640 is configured to receive signals from GPS satellites for use in calculating a location. The location calculated by the GPS sensor 640 can be used by any application program that requires or benefits from location information. For example, the location calculated by the GPS sensor 640 can be used with a navigation application program to provide directions from the location to a destination or directions from the destination to the location. Moreover, the GPS sensor 640 can be used to provide location information to an external location-based service, such as E911 service. The GPS sensor 640 can obtain location information generated via WI-FI, WIMAX, and/or cellular triangulation techniques utilizing one or more of the network connectivity components 606 to aid the GPS sensor 640 in obtaining a location fix. The GPS sensor 640 can also be used in Assisted GPS ("A-GPS") systems.

The I/O components 610 include a display 642, a touchscreen 644, a data I/O interface component ("data I/O") 646, an audio I/O interface component ("audio I/O") 648, a video I/O interface component ("video I/O") 650, and a camera 652. In some configurations, the display 642 and the touchscreen 644 are combined. In some configurations two or more of the data I/O component 646, the audio I/O component 648, and the video I/O component 650 are combined. The I/O components 610 can include discrete processors configured to support the various interfaces described below, or might include processing functionality built-in to the processor 602.

The display 642 is an output device configured to present information in a visual form. In particular, the display 642 can present graphical user interface ("GUI") elements, text, images, video, notifications, virtual buttons, virtual keyboards, messaging data, Internet content, device status, time, date, calendar data, preferences, map information, location information, and any other information that is capable of being presented in a visual form. In some configurations, the display 642 is a liquid crystal display ("LCD") utilizing any active or passive matrix technology and any backlighting technology (if used). In some configurations, the display 642 is an organic light emitting diode ("OLED") display. Other display types are contemplated.

The touchscreen 644 is an input device configured to detect the presence and location of a touch. The touchscreen 644 can be a resistive touchscreen, a capacitive touchscreen, a surface acoustic wave touchscreen, an infrared touchscreen, an optical imaging touchscreen, a dispersive signal touchscreen, an acoustic pulse recognition touchscreen, or can utilize any other touchscreen technology. In some configurations, the touchscreen 644 is incorporated on top of the display 642 as a transparent layer to enable a user to use one or more touches to interact with objects or other information presented on the display 642. In other configurations, the touchscreen 644 is a touch pad incorporated on a surface of the computing device that does not include the display 642. For example, the computing device can have a touchscreen incorporated on top of the display 642 and a touch pad on a surface opposite the display 642.

In some configurations, the touchscreen 644 is a single-touch touchscreen. In other configurations, the touchscreen 644 is a multi-touch touchscreen. In some configurations, the touchscreen 644 is configured to detect discrete touches, single touch gestures, and/or multi-touch gestures. These are collectively referred to herein as "gestures" for convenience. Several gestures will now be described. It should be understood that these gestures are illustrative and are not intended to limit the scope of the appended claims. Moreover, the described gestures, additional gestures, and/or alternative gestures can be implemented in software for use with the touchscreen 644. As such, a developer can create gestures that are specific to a particular application program.

In some configurations, the touchscreen 644 supports a tap gesture in which a user taps the touchscreen 644 once on an item presented on the display 642. The tap gesture can be used for various reasons including, but not limited to, opening or launching whatever the user taps, such as a graphical icon representing the application 104. In some configurations, the touchscreen 644 supports a double tap gesture in which a user taps the touchscreen 644 twice on an item presented on the display 642. The double tap gesture can be used for various reasons including, but not limited to, zooming in or zooming out in stages. In some configurations, the touchscreen 644 supports a tap and hold gesture in which a user taps the touchscreen 644 and maintains contact for at least a pre-defined time. The tap and hold gesture can be used for various reasons including, but not limited to, opening a context-specific menu.

In some configurations, the touchscreen 644 supports a pan gesture in which a user places a finger on the touchscreen 644 and maintains contact with the touchscreen 644 while moving the finger on the touchscreen 644. The pan gesture can be used for various reasons including, but not limited to, moving through screens, images, or menus at a controlled rate. Multiple finger pan gestures are also contemplated. In some configurations, the touchscreen 644 supports a flick gesture in which a user swipes a finger in the direction the user wants the screen to move. The flick gesture can be used for various reasons including, but not limited to, scrolling horizontally or vertically through menus or pages. In some configurations, the touchscreen 644 supports a pinch and stretch gesture in which a user makes a pinching motion with two fingers (e.g., thumb and forefinger) on the touchscreen 644 or moves the two fingers apart. The pinch and stretch gesture can be used for various reasons including, but not limited to, zooming gradually in or out of a website, map, or picture.

Although the gestures described above have been presented with reference to the use of one or more fingers for performing the gestures, other appendages such as toes or objects such as styluses can be used to interact with the touchscreen 644. As such, the above gestures should be understood as being illustrative and should not be construed as being limiting in any way.

The data I/O interface component 646 is configured to facilitate input of data to the computing device and output of data from the computing device. In some configurations, the data I/O interface component 646 includes a connector configured to provide wired connectivity between the computing device and a computer system, for example, for synchronization operation purposes. The connector can be a proprietary connector or a standardized connector such as USB, micro-USB, mini-USB, USB-C, or the like. In some configurations, the connector is a dock connector for docking the computing device with another device such as a docking station, audio device (e.g., a digital music player), or video device.

The audio I/O interface component 648 is configured to provide audio input and/or output capabilities to the computing device. In some configurations, the audio I/O interface component 646 includes a microphone configured to collect audio signals. In some configurations, the audio I/O interface component 646 includes a headphone jack configured to provide connectivity for headphones or other external speakers. In some configurations, the audio interface component 648 includes a speaker for the output of audio signals. In some configurations, the audio I/O interface component 646 includes an optical audio cable out.

The video I/O interface component 650 is configured to provide video input and/or output capabilities to the computing device. In some configurations, the video I/O interface component 650 includes a video connector configured to receive video as input from another device (e.g., a video media player such as a DVD or BLU-RAY player) or send video as output to another device (e.g., a monitor, a television, or some other external display). In some configurations, the video I/O interface component 650 includes a High-Definition Multimedia Interface ("HDMI"), mini-HDMI, micro-HDMI, DisplayPort, or proprietary connector to input/output video content. In some configurations, the video I/O interface component 650 or portions thereof is combined with the audio I/O interface component 648 or portions thereof.

The camera 652 can be configured to capture still images and/or video. The camera 652 can utilize a charge coupled device ("CCD") or a complementary metal oxide semiconductor ("CMOS") image sensor to capture images. In some configurations, the camera 652 includes a flash to aid in taking pictures in low-light environments. Settings for the camera 652 can be implemented as hardware or software buttons.

Although not illustrated, one or more hardware buttons can also be included in the computing device architecture 600. The hardware buttons can be used for controlling some operational aspect of the computing device. The hardware buttons can be dedicated buttons or multi-use buttons. The hardware buttons can be mechanical or sensor-based.

The illustrated power components 612 include one or more batteries 654, which can be connected to a battery gauge 656. The batteries 654 can be rechargeable or disposable. Rechargeable battery types include, but are not limited to, lithium polymer, lithium ion, nickel cadmium, and nickel metal hydride. Each of the batteries 654 can be made of one or more cells.

The battery gauge 656 can be configured to measure battery parameters such as current, voltage, and temperature. In some configurations, the battery gauge 656 is configured to measure the effect of a battery's discharge rate, temperature, age and other factors to predict remaining life within a certain percentage of error. In some configurations, the battery gauge 656 provides measurements to an application program that is configured to utilize the measurements to present useful power management data to a user. Power management data can include one or more of a percentage of battery used, a percentage of battery remaining, a battery condition, a remaining time, a remaining capacity (e.g., in watt hours), a current draw, and a voltage.

The power components 612 can also include a power connector, which can be combined with one or more of the aforementioned I/O components 610. The power components 612 can interface with an external power system or charging equipment via a power I/O component 644. Other configurations can also be utilized.

The disclosure presented herein also encompasses the subject matter set forth in the following clauses:

Clause 1. A computer-implemented method for reducing an amount of network bandwidth utilized to transfer a file, the method comprising: receiving, at a computing device, a request to open the file; responsive to receiving the request, identifying one or more embedded objects in the file; replacing the embedded objects in the file with corresponding unique placeholder objects, the placeholder objects comprising objects that are more highly compressible than the embedded objects; compressing the file; transmitting the file to a network service configured to generate a processed file based upon the file, the processed file containing the unique placeholder objects; receiving, at the computing device, the processed file from the network service; replacing the unique placeholder objects in the processed file with corresponding embedded objects; and opening the processed file.

Clause 2. The computer-implemented method of clause 1, wherein the embedded objects comprise embedded images, and wherein the unique placeholder objects comprise images having a single color and having a same height and width as a corresponding embedded image.

Clause 3. The computer-implemented method of clauses 1 and 2, further comprising: generating hash values for the unique placeholder objects, and wherein replacing the unique placeholder objects in the processed file with corresponding embedded objects comprises utilizing the hash values for the unique placeholder objects to replace the unique placeholder objects in the processed file with the embedded objects.

Clause 4. The computer-implemented method of clauses 1 through 3, wherein the file is formatted using a first data format, wherein the processed file is formatted using a second data format, and wherein the network service is configured to convert between the first data format and the second data format.

Clause 5. The computer-implemented method of clauses 1 through 4, wherein the file comprises an object linking and embedding (OLE) structured storage file comprising summary information, a pictures stream containing the one or more embedded objects, and a document stream.

Clause 6. The computer-implemented method of clauses 1 through 5, further comprising removing the summary information from the file prior to transmitting the file to the network service.

Clause 7. The computer-implemented method of clauses 1 through 6, further comprising, prior to transmitting the file to the network service, inserting padding bytes into the pictures stream such that a size of the one or more placeholder objects is a same size as the corresponding embedded objects.

Clause 8. An apparatus, comprising: one or more processors; and at least one computer storage medium having computer executable instructions stored thereon which, when executed by the one or more processors, cause the apparatus to receive a request to open a file, in response to the request, identify one or more embedded objects in the file, replace the embedded objects in the file with corresponding unique placeholder objects, the placeholder objects comprising objects that are more highly compressible than the embedded objects, compress the file, transmit the file to a network service configured to generate a processed file from the file, the processed file containing the unique placeholder objects, receive the processed file from the network service, replace the unique placeholder objects in the processed file with corresponding embedded objects, and open the processed file.

Clause 9. The apparatus of clause 8, wherein the embedded objects comprise embedded images, and wherein the unique placeholder objects comprise images having a single color and having a same height and width as a corresponding embedded image.

Clause 10. The apparatus of clauses 8 through 9, wherein the computer storage medium has further computer executable instructions stored thereon to: generate unique hash values for the unique placeholder objects, and wherein replace the unique placeholder objects in the processed file with corresponding embedded objects comprises using the hash values for the unique placeholder objects to replace the unique placeholder objects in the processed file with the embedded objects.

Clause 11. The apparatus of clauses 8 through 10, wherein the file is formatted using a first data format, wherein the processed file is formatted using a second data format, and wherein the network service is configured to convert the file from the first data format to the second data format.

Clause 12. The apparatus of clauses 8 through 11, wherein the file comprises an object linking and embedding (OLE) structured storage file comprising summary information, a pictures stream containing the one or more embedded objects, and a document stream.

Clause 13. The apparatus of clauses 8 through 12, wherein the computer storage medium has further computer executable instructions stored thereon remove the summary information from the file prior to transmitting the file to the network service.

Clause 14. The apparatus of clauses 8 through 12, wherein the computer storage medium has further computer executable instructions stored thereon to insert padding bytes into the pictures stream prior to transmitting the file to the network service such that a size of each of the one or more placeholder objects is a same size a corresponding embedded object.

Clause 15. An apparatus, comprising: one or more processors; and at least one computer storage medium having computer executable instructions stored thereon which, when executed by the one or more processors, cause the apparatus to identify one or more embedded objects in a file, replace the embedded objects in the file with corresponding unique placeholder objects, compress the file, transmit the file to a network service, receive a processed file containing the unique placeholder objects from the network service, and replace the unique placeholder objects in the processed file with corresponding embedded objects from the file.

Clause 16. The apparatus of clause 15, wherein the embedded objects comprise embedded images, and wherein the unique placeholder objects comprise images having a single color and having a same height and width as a corresponding embedded image.

Clause 17. The apparatus of clauses 15 through 16, wherein the computer storage medium has further computer executable instructions stored thereon to: generate hash values for the unique placeholder objects, and wherein replace the unique placeholder objects in the processed file with corresponding embedded objects from the file comprises using the hash values for the unique placeholder objects to replace the unique placeholder objects in the processed file with the embedded objects from the file.

Clause 18. The apparatus of clauses 15 through 17, wherein the file is formatted using a first data format, wherein the processed file is formatted using a second data format, and wherein the network service is configured to convert the file from the first data format to the second data format.

Clause 19. The apparatus of clauses 15 through 18, wherein the file comprises an object linking and embedding (OLE) structured storage file comprising summary information, a pictures stream containing the one or more embedded objects, and a document stream.

Clause 20. The apparatus of clauses 15 through 19, wherein the computer storage medium has further computer executable instructions stored thereon remove the summary information from the file prior to transmitting the file to the network service.

Based on the foregoing, it should be appreciated that various technologies for reducing network bandwidth utilization during file transfer have been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A computer-implemented method for reducing an amount of network bandwidth utilized to transfer a file, the method comprising:
    receiving, at a computing device, a request to open the file;
    responsive to receiving the request, identifying one or more embedded objects in the file;
    removing the one or more embedded objects from the file;
    prior to transmitting the file to the network service,
        inserting padding bytes into the file such that a size of the one or more placeholder objects is a same size as the corresponding embedded objects;
    inserting one or more unique placeholder objects in the file to replace the one or more embodied objects, the placeholder objects being objects that are more highly compressible than the embedded objects;
    compressing the file;
    transmitting the file to a network service configured to generate a processed file based upon the file, the processed file containing the unique placeholder objects;
    receiving, at the computing device, the processed file from the network service;
    replacing the unique placeholder objects in the processed file with corresponding embedded objects; and
    opening the processed file.

2. The computer-implemented method of claim 1, wherein the embedded objects comprise embedded images, and wherein the unique placeholder objects comprise images having a single color and having a same height and width as a corresponding embedded image.

3. The computer-implemented method of claim 1, further comprising:
    generating hash values for the unique placeholder objects, and
    wherein replacing the unique placeholder objects in the processed file with corresponding embedded objects comprises utilizing the hash values for the unique placeholder objects to replace the unique placeholder objects in the processed file with the embedded objects.

4. The computer-implemented method of claim 1, wherein the file is formatted using a first data format, wherein the processed file is formatted using a second data format, and wherein the network service is configured to convert between the first data format and the second data format.

5. The computer-implemented method of claim 1, wherein the file comprises an object linking and embedding (OLE) structured storage file comprising summary information, a pictures stream containing the one or more embedded objects, and a document stream.

6. The computer-implemented method of claim 5, further comprising removing the summary information from the file prior to transmitting the file to the network service.

7. An apparatus, comprising:
    one or more processors; and
    at least one computer storage medium having computer executable instructions stored thereon which, when executed by the one or more processors, cause the apparatus to
    receive a request to open a file,
    in response to the request, identify one or more embedded objects in the file,
    remove the one or more embedded objects from the file,
    prior to transmitting the file to the network service,
        insert padding bytes into the file such that a size of the one or more placeholder objects is a same size as the corresponding embedded objects,
    insert one or more unique placeholder objects in the file to replace the one or more embodied objects, the placeholder objects being objects that are more highly compressible than the one or more embedded objects,
    compress the file,
    transmit the file to a network service configured to generate a processed file from the file, the processed file containing the unique placeholder objects,
    receive the processed file from the network service,
    replace the unique placeholder objects in the processed file with corresponding embedded objects, and
    open the processed file.

8. The apparatus of claim 7, wherein the embedded objects comprise embedded images, and wherein the unique placeholder objects comprise images having a single color and having a same height and width as a corresponding embedded image.

9. The apparatus of claim 7, wherein the computer storage medium has further computer executable instructions stored thereon to:
generate unique hash values for the unique placeholder objects, and
wherein replace the unique placeholder objects in the processed file with corresponding embedded objects comprises using the hash values for the unique placeholder objects to replace the unique placeholder objects in the processed file with the embedded objects.

10. The apparatus of claim 7, wherein the file is formatted using a first data format, wherein the processed file is formatted using a second data format, and wherein the network service is configured to convert the file from the first data format to the second data format.

11. The apparatus of claim 7, wherein the file comprises an object linking and embedding (OLE) structured storage file comprising summary information, a pictures stream containing the one or more embedded objects, and a document stream.

12. The apparatus of claim 11, wherein the computer storage medium has further computer executable instructions stored thereon remove the summary information from the file prior to transmitting the file to the network service.

13. The apparatus of claim 11, wherein the computer storage medium has further computer executable instructions stored thereon to insert padding bytes into the pictures stream prior to transmitting the file to the network service such that a size of each of the one or more placeholder objects is a same size a corresponding embedded object.

14. An apparatus, comprising:
one or more processors; and
at least one computer storage medium having computer executable instructions stored thereon which, when executed by the one or more processors, cause the apparatus to
identify one or more embedded objects in a file,
remove the one embedded objects from the file,
insert unique placeholder objects to replace the one or more embodied objects,
prior to transmitting the file to the network service, insert padding bytes into the file such that a size of the one or more placeholder objects is a same size as the corresponding embedded objects,
compress the file,
transmit the file to a network service,
receive a processed file containing the unique placeholder objects from the network service, and
replace the unique placeholder objects in the processed file with corresponding embedded objects from the file.

15. The apparatus of claim 14, wherein the embedded objects comprise embedded images, and wherein the unique placeholder objects comprise images having a single color and having a same height and width as a corresponding embedded image.

16. The apparatus of claim 14, wherein the computer storage medium has further computer executable instructions stored thereon to:
generate hash values for the unique placeholder objects, and
wherein replace the unique placeholder objects in the processed file with corresponding embedded objects from the file comprises using the hash values for the unique placeholder objects to replace the unique placeholder objects in the processed file with the embedded objects from the file.

17. The apparatus of claim 14, wherein the file is formatted using a first data format, wherein the processed file is formatted using a second data format, and wherein the network service is configured to convert the file from the first data format to the second data format.

18. The apparatus of claim 14, wherein the file comprises an object linking and embedding (OLE) structured storage file comprising summary information, a pictures stream containing the one or more embedded objects, and a document stream.

19. The apparatus of claim 18, wherein the computer storage medium has further computer executable instructions stored thereon remove the summary information from the file prior to transmitting the file to the network service.

* * * * *